US012592718B2

(12) United States Patent
Gheorghe et al.

(10) Patent No.: US 12,592,718 B2
(45) Date of Patent: Mar. 31, 2026

(54) SIGMA-DELTA ANALOG-TO-DIGITAL CONVERTER AND METHOD FOR CONVERTING AN ANALOG INPUT SIGNAL TO A DIGITAL OUTPUT SIGNAL AT A SAMPLING FREQUENCY

(71) Applicant: Infineon Technologies AG, Neubiberg (DE)

(72) Inventors: Andrei-Sorin Gheorghe, Bucharest (RO); Dan Ioan Dumitru Stoica, Bucharest (RO); Ilie-Ionut Cristea, Bucharest (RO)

(73) Assignee: Infineon Technologies AG, Neubiberg (DE)

( * ) Notice: Subject to any disclaimer, the term of this patent is extended or adjusted under 35 U.S.C. 154(b) by 96 days.

(21) Appl. No.: 18/402,964

(22) Filed: Jan. 3, 2024

(65) Prior Publication Data

US 2024/0250693 A1     Jul. 25, 2024

(30) Foreign Application Priority Data

Jan. 20, 2023     (DE) .......................... 102023101437.4

(51) Int. Cl.
*H03M 3/00*          (2006.01)
*G01R 33/07*        (2006.01)
(52) U.S. Cl.
CPC ........... *H03M 3/464* (2013.01); *H03M 3/496* (2013.01); *G01R 33/075* (2013.01)

(58) Field of Classification Search
CPC ........ H03M 3/464; H03M 3/496; H03M 3/34; G01R 33/075
See application file for complete search history.

(56) References Cited

U.S. PATENT DOCUMENTS

| | | | | | |
|---|---|---|---|---|---|
| 7,098,823 | B2 * | 8/2006 | O'Dowd | ................. | H03M 3/34 |
| | | | | | 341/118 |
| 7,391,351 | B2 * | 6/2008 | Pertijs | ................. | H03M 3/3287 |
| | | | | | 341/143 |
| 9,685,967 | B1 * | 6/2017 | Motz | ....................... | H03M 3/34 |
| 2006/0256889 | A1 * | 11/2006 | Amano | ................... | H04L 27/12 |
| | | | | | 375/334 |

(Continued)

*Primary Examiner* — Jean B Jeanglaude

(74) *Attorney, Agent, or Firm* — Harrity & Harrity, LLP

(57)          ABSTRACT

A sigma-delta analog-to-digital converter is configured to convert an analog input signal to a digital output signal at a sampling frequency ($f_s$). The sigma-delta analog-to-digital converter includes a chopper circuit configured to shift the analog input signal from an original frequency to a chopper frequency ($f_{chop}=f_s/N$) to generate a chopped analog signal, where N is a positive integer with N≥1. A chopper period includes a first chopper phase and a second chopper phase. The sigma-delta analog-to-digital converter also includes a timing circuit configured to adjust at least one of a duration of the first chopper phase or a duration of the second chopper phases according to $(N/2-k)\cdot T_s$, with k being an odd integer equal to or larger than 1, and $T_s$ being a sampling period $1/f_s$ of the sigma-delta analog-to-digital converter.

18 Claims, 6 Drawing Sheets

100

(56)  References Cited

U.S. PATENT DOCUMENTS

2009/0140900 A1      6/2009  Pun et al.
2013/0009678 A1*     1/2013  Motz ................... G01R 15/202
                                                                 327/124
2021/0344315 A1     11/2021  Motz et al.
2022/0173750 A1*     6/2022  Motz ................... H03M 3/356

* cited by examiner

100

SIGMA-DELTA ANALOG-TO-DIGITAL CONVERTER AND METHOD FOR CONVERTING AN ANALOG INPUT SIGNAL TO A DIGITAL OUTPUT SIGNAL AT A SAMPLING FREQUENCY

CROSS-REFERENCE TO RELATED APPLICATION

This application claims priority to German Patent Application No. 102023101437.4 filed on Jan. 20, 2023, the content of which is incorporated by reference herein in its entirety.

TECHNICAL FIELD

The present disclosure generally relates to analog-to-digital converters (ADCs) and, more particularly, to chopped sigma-delta analog-to-digital converters ($\Sigma\Delta$-ADCs).

BACKGROUND

Many modern devices, such as vehicles, for example, include a plurality of sensors. Such sensors may be "fast switching" to provide information about an operation of a device to a digital control unit, which can take an action based upon the information. For example, the control unit of a vehicle may be configured to control fuel injection components based on a position of a camshaft. To this end, a toothed wheel may be affixed to the camshaft and a magnetic sensor, e.g., Hall sensor, may be arranged to detect teeth on the wheel. The sensor may output an analog signal that indicates the presence (or absence) of a tooth. The sensor's analog signal may be converted to a digital signal by an ADC to enable digital processing components in the control unit to determine the position of the camshaft. Both ADCs and digital-to-analog converters (DACs) can employ sigma-delta ($\Sigma\Delta$) modulation. A $\Sigma\Delta$ ADC may first encode an analog signal using high-frequency $\Sigma\Delta$ modulation, and then apply a digital filter to form a higher-resolution but lower sample-frequency digital output. A $\Sigma\Delta$ DAC may encode a high-resolution digital input signal into a lower-resolution but higher sample-frequency signal that may be mapped to voltages, and then may be smoothed with an analog filter. In both cases, the temporary use of a lower-resolution signal may simplify circuit design and improve efficiency.

$\Sigma\Delta$ ADCs and $\Sigma\Delta$ DACs may be combined with chopping. Chopping refers to a technique that can be used to cancel offset voltages and other low frequency errors. Chopper circuits are a type of electrical circuit in which a signal to be amplified is modulated (chopped), amplified and demodulated again. By using such a technique, a zero-point error (or offset error) and a so-called 1/f noise of an amplifier can be shifted to a frequency band which is not of interest. Chopper circuits can be used, for example, in bandgap circuits that provide a defined reference voltage, but can also be used in other applications where a signal needs to be processed, such as in $\Sigma\Delta$-ADCs. An offset that arises within various amplifiers of a 24 modulator can generally be nulled out, either by local chopping or auto-zeroing an amplifier. However, other offset errors cannot be removed by these means. A solution implemented on these ADCs may be to chop an entire analog signal chain within the ADC. This may remove any offset and low frequency errors, giving extremely low offset errors and drift.

Aliasing of quantization noise may be a problem, especially for chopping frequencies lower than a $\Sigma\Delta$ modulator's sampling frequency. Thus, the use of conventional chopping in a $\Sigma\Delta$-ADC may lead to undesired quantization noise effects.

SUMMARY

Thus, there may be a desire to improve the noise behavior of chopped $\Sigma\Delta$-ADCs. This need is addressed by apparatuses and methods in accordance with the independent claims. Possibly advantageous implementations are addressed by the dependent claims.

According to a first aspect, the present disclosure provides a $\Sigma\Delta$-ADC for converting an analog input signal to a digital output signal at a sampling frequency $f_s$. The $\Sigma\Delta$-ADC includes a chopper circuit which is configured to shift the analog input signal from an original frequency to a chopping frequency $f_{chop}$ to generate a chopped analog signal. The chopping frequency can be expressed as $f_{chop}=f/N$, wherein N is a positive integer with N≥1. A chopping period includes a first chopping phase and a second chopping phase. The $\Sigma\Delta$-ADC also includes a timing circuit which is configured to adjust a duration of at least one of the first and the second chopping phases according to $(N/2-k)\cdot T_s$, with k being an odd integer equal to or larger than 1, e.g., k=1, 3, 5, 7, . . . (2n−1), with n=1, 2, 3, 4, 5 . . . .

$T_s=1/f_s$ denotes a sampling period of the $\Sigma\Delta$-ADC. By adjusting the duration of at least one of the first and the second chopping phases (or chopper windows) according to $(N/2-k)\cdot T_s$, an integrator and the chopping phases may be desynchronized, leading to an improved quantization noise behavior of $\Sigma\Delta$-ADCs in accordance with implementations of the present disclosure.

In some implementations, the timing circuit of the $\Sigma\Delta$-ADC is configured to adjust the duration of both the first and the second chopping phase according to $(N/2-k)\cdot T_s$. As the first and the second chopping phase together form the chopping period, a duration of the chopping period may then correspond to $T_{chop}=(N-2k)\cdot T_s$.

In some implementations, the timing circuit is configured to adjust the duration of the first chopping phase according to $(N/2-k)\cdot T_s$ and the duration of the second chopping phase according to $N/2\ T_s$. As the first and the second chopping phase together form the chopping period, the duration of the chopping period may then correspond to $T_{chop}=(N-k)\cdot T_s$.

In some implementations, k=1, such that the duration of the chopping period may then correspond to $T_{chop}=(N-2)\cdot T_s$ or $T_{chop}=(N-1)\cdot T_s$.

In some implementations, the $\Sigma\Delta$-ADC further includes a spinning Hall-sensor coupled to an input of the $\Sigma\Delta$-ADC. A spinning period of the spinning Hall-sensor includes a first spinning phase, a second spinning phase, a third spinning phase, and a fourth spinning phase. The timing circuit may be configured to adjust respective durations of two of the four spinning phases according to an odd number of sampling periods and respective durations of the other two of the four spinning phases according to an even number of sampling periods of the $\Sigma\Delta$-ADC.

In some implementations, the timing circuit is configured to adjust the duration of the first spinning phase according to $(N/4-1)\cdot T_s$, the duration of the second spinning phase according to $(N/4)\cdot T_s$, the duration of the third spinning phase according to $(N/4-1)\cdot T_s$, and the duration of the fourth spinning phase according to $(N/4)\cdot T_s$. As the first to fourth spinning phases together form the spinning period, the duration of the spinning period may then correspond to $T_{spin}=(N-2k)\cdot T_s$ (e.g., k=1).

In some implementations, the ΣΔ-ADC includes a first chopper circuit which is configured to shift the analog input signal from the original frequency to the chopping frequency to generate the chopped analog signal, a difference amplifier (e.g., an operational transconductance amplifier, OTA) which is configured to amplify the chopped analog signal to generate an amplified analog signal, and a second chopper circuit which is configured to demodulate the amplified analog signal to generate a demodulated analog signal having a signal component at the original frequency. The second chopper circuit may thus be coupled to the output of the difference amplifier.

In some implementations, ΣΔ-ADC further includes an integrator circuit coupled to an output of the second chopper circuit, and a coarse ADC (e.g., 1-bit ADC) configured to convert an output of the integrator to the digital output signal.

In some implementations, the ΣΔ-ADC further includes a feedback path coupled between an output of the coarse (e.g., 1-bit) ADC (e.g., comparator) and an output of the difference amplifier or an input of the second chopper circuit. The feedback path may include a chopped digital-to-analog converter (DAC). In the time domain, the analog input signal and the output of the DAC are differentiated, providing a differentiated signal. This differentiated signal is presented to the integrator, whose output progresses in a negative or positive direction. The slope and direction of the output of the integrator is dependent on the sign and magnitude of its input signal. At the time the output of the integrator equals a comparator reference signal, the output of the coarse ADC (e.g., comparator) switches from negative to positive, or positive to negative.

According to a second aspect, the present disclosure provides an ΣΔ-ADC for converting an analog input signal to a digital output signal at a sampling frequency $f_s$. The ΣΔ-ADC includes a chopper circuit which is configured to shift the analog input signal from an original frequency to a chopping frequency to generate a chopped analog signal. A chopping period includes a first chopping phase and a second chopping phase. The ΣΔ-ADC includes also includes a timing circuit which is configured to adjust a duration of at least one of the first and the second chopping phases according to $(4n-1) \cdot T_s$, with n being an integer equal to or larger than 1, and $T_s$ being a sampling period $1/f_s$ of the ΣΔ-ADC.

In some implementations, the timing circuit is configured to adjust the duration of both the first and the second chopping phases according to $(4n-1) \cdot T_s$. As the first and the second chopping phase together form the chopping period, a duration of the chopping period may then correspond to $T_{chop}=(8n-2) \cdot T_s$.

In some implementations, the timing circuit is configured to adjust the duration of the first chopping phase according to $(4n-1) \cdot T_s$ and the duration of the second chopping phase according to $(4n) \cdot T_s$. As the first and the second chopping phase together form the chopping period, a duration of the chopping period may then correspond to $T_{chop}=(8n-1) \cdot T_s$.

In some implementations, the ΣΔ-ADC further includes a spinning Hall-sensor coupled to an input of the ΣΔ-ADC. A spinning period of the spinning Hall-sensor includes a first spinning phase, a second spinning phase, a third spinning phase, and a fourth spinning phase. The timing circuit may be configured to adjust the duration of the first spinning phase according to $(2n-1) \cdot T_s$, the duration of the second spinning phase according to $2n \cdot T_s$, the duration of the third spinning phase according to $(2n-1) \cdot T_s$, and the duration of the fourth spinning phase according to $2n \cdot T_s$. As the first and the second spinning phase together may form the first chopping phase, a duration of the first chopping phase may then correspond to $T_{ph1}=(4n-1) \cdot T_s$. As the third and the fourth spinning phase together may form the second chopping phase, a duration of the second chopping phase may then also correspond to $T_{ph2}=(4n-1) \cdot T_s$.

According to a yet a further aspect, the present disclosure provides method for converting an analog input signal to a digital output signal at a sampling frequency, $f_s$. The method includes an act of shifting the analog input signal from an original frequency to a chopping frequency to generate a chopped analog signal, wherein a chopping period includes a first chopping phase and a second chopping phase; and an act of adjusting a duration of at least one of the first and the second chopping phases according to $(4n-1) \cdot T_s$, with n being an integer equal to or larger than 1, and $T_s$ being a sampling period $1/f_s$ of the ΣΔ-ADC.

BRIEF DESCRIPTION OF THE DRAWINGS

Some examples of apparatuses and/or methods will be described in the following by way of example only, and with reference to the accompanying figures, in which.

DETAILED DESCRIPTION

Figure 1:
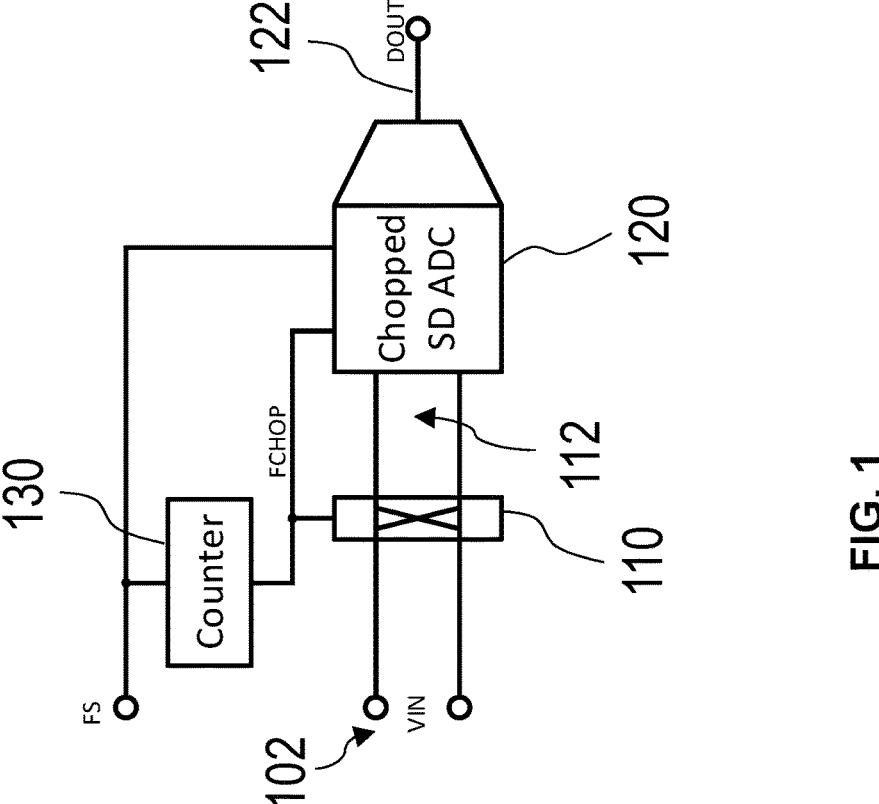
FIG. 1 illustrates a schematic block diagram of a sensor system that comprises a chopped ΣΔ-ADC for converting an analog input signal at an original frequency to a digital output signal.

Some examples are now described in more detail with reference to the enclosed figures. However, other possible examples are not limited to the features of these implementations described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, e.g., only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

Sensors often introduce errors into an analog signal they output due to intrinsic characteristics of the sensors themselves. For example, an offset error may be included in an analog signal output by a Hall sensor. However, spinning current techniques may help to distinguish between the error and the sensor signal as will be described in more detail below. The spinning technique may transform the offset error component in the Hall sensor signal into a high frequency error (called offset ripple) while the sensor signal remains low frequency or DC.

ADCs may include amplifiers and/or integrators that may also introduce an offset error into the signals they process. The amplifier or integrator offset error may add to the offset error introduced by the Hall sensor. To compensate for the sensor's offset error and/or amplifier offset error, some ADCs include choppers. Choppers are circuits that modulate the sensor signal to a higher frequency, which shifts the sensor output signal to a higher frequency range (e.g., the chopping frequency $f_{chop}$) while the offset error component remains in a lower frequency range, making the offset error component easier to distinguish from the signal component. For the purposes of this description, the modulated sensor signal at the chopping frequency output by chopper circuit will be referred to as being "chopped" or "at the chopping frequency" to be contrasted with sensor signals that have not been modulated or have been re-modulated to the original frequency of the sensor signal, which will be referred to as having "the original frequency."

FIG. 1 illustrates a schematic block diagram of a sensor system that comprises an ADC circuit 100 for converting an analog input signal VIN (e.g., a sensor signal) at an original frequency to a digital output signal DOUT.

The analog input signal VIN may be assumed to be band-limited, and the signal bandwidth may be assumed to be much lower than a sampling frequency $f_s$ of the ADC circuit 100. The analog input signal VIN may include a signal component and an offset error component that may be introduced by a sensor (not shown) measuring a physical quantity (e.g., a Hall sensor to measure a magnetic field). To account for the offset error component in the analog input signal VIN, the ADC circuit 100 comprises a chopper circuit 110 coupled between an input terminal 102 for the analog input signal VIN and an input terminal of a chopped $\Sigma\Delta$-ADC circuit 120 (i.e., a chopped SD-ADC circuit). The chopper circuit 110 may be considered external to the chopped $\Sigma\Delta$-ADC circuit 120 and comprises a modulator circuit which is clocked at a chopping frequency $f_{chop}$. The chopping frequency $f_{chop}$ may be lower than the sampling frequency $f_s$ of the ADC circuit 100. A chopping clock signal at chopping frequency $f_{chop}$ may be derived from a sampling clock signal at sampling frequency $f_s$ using a timing circuit 130. Timing circuit 130 may be configured to perform a frequency division of the sampling frequency $f_s$ to obtain the chopping clock signal at chopping frequency $f_{chop}$. For example, this may be done via a counter which triggers a state transition (from low to high, or from high to low) of the chopping clock signal after j sampling clock pulses. The chopper or modulator circuit 110 is configured to shift the analog input signal VIN from its original frequency (which may be DC) to the chopping frequency $f_{chop}$ to generate a chopped analog signal 112 at the input of chopped $\Sigma\Delta$-ADC circuit 120.

In accordance with various example implementations, the $\Delta\Sigma$-ADC circuit 120 may include an amplifier circuit for the chopped analog signal 112 to generate an amplified analog signal, a demodulator circuit clocked at the chopping frequency $f_{chop}$ and configured to demodulate the amplified analog signal to generate a demodulated analog signal having a signal component at the original frequency. The $\Sigma\Delta$-ADC circuit 120 may further include a $\Sigma\Delta$ modulator and a digital/decimation filter to convert the analog input signal VIN to a digital output signal 122 (DOUT). The $\Sigma\Delta$ modulator may coarsely sample the analog input signal VIN at a very high rate into a 1-bit stream. The digital/decimation filter may then take this sampled data and convert it into a high-resolution, slower digital code. While most converters have one sampling rate, a $\Sigma\Delta$-ADC has two—the input sampling rate/frequency $f_s$ and an output data rate ($f_D$).

Figure 2:
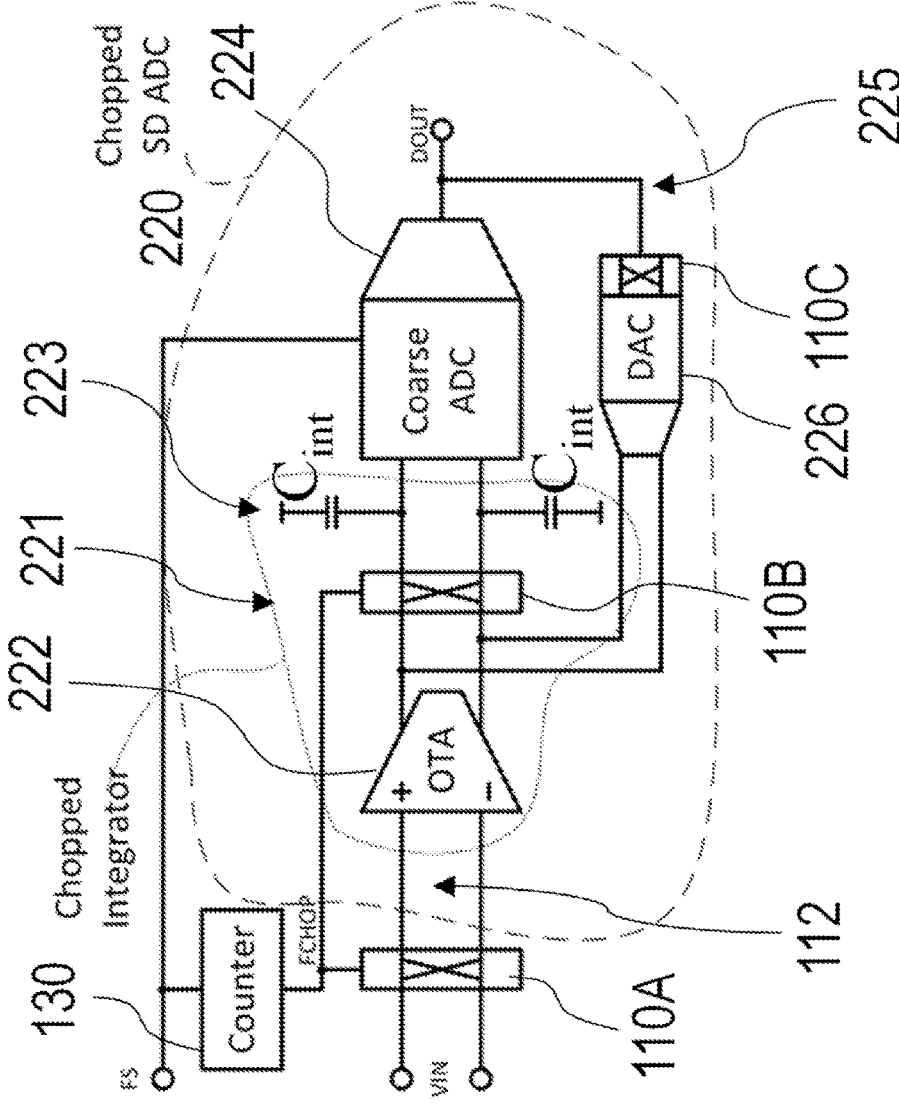
FIG. 2 shows a block diagram of an example implementation of a chopped ΣΔ-ADC circuit.

A block diagram of an example implementation of ADC circuit 100 for converting an analog input signal VIN at an original frequency to a digital output signal DOUT is shown in FIG. 2.

The chopped $\Sigma\Delta$-ADC circuit comprises a (oversampling) $\Sigma\Delta$-modulator 220. The $\Sigma\Delta$-modulator 220 includes a forward path 221 and a feedback path 225. The forward path 221 may include a pair of analog chopper circuits 110A/110B, a voltage to current converter (OTA) 222 which contains an offset of its own, an integrator 223, and a coarse ADC (e.g., 1-bit comparator) 224 clocked at the sampling frequency/rate $f_s$. The integrator 223 has the effect of shaping quantization noise to higher frequencies. OTA 222 may convert the differential voltage VIN between its non-inverting and inverting input to currents at its outputs. OTA 222 may also be referred to as difference (or differential) amplifier. Recall that the sensor signal VIN from the Hall sensor (or another sensor type) may be a very small nearly DC signal with an offset error that is caused by intrinsic characteristics of the Hall sensor. The analog chopper 110A multiplies the analog sensor signal VIN by a square wave having the chopping frequency $f_{chop}$ and amplitudes of +1 and −1. The resulting chopped analog input signal 112 has a signal component corresponding to a square wave having period $T_{chop}=1/f_{chop}$ and an offset error component that is DC.

The OTA 222 may then be used to amplify the chopped analog input signal 112. The OTA 222 may also introduce a DC amplifier offset error that adds to the DC offset error of the Hall sensor. After the chopped analog input signal 112 is amplified, the amplified signal at the output of OTA 222 may be demodulated by the second analog chopper circuit 110B to generate a signal in which the sensor component of the signal component has its original low frequency while the offset component (including both the Hall and amplifier offset) is an AC signal at the chopping frequency $f_{chop}$. The coarse ADC 224 converts the output of the integrator 223 to a digital value, which is the digital output signal DOUT of the $\Sigma\Delta$-modulator 220.

The feedback path 225 of the $\Sigma\Delta$-modulator 220 may include a (chopped) DAC (also called $\Sigma\Delta$-DAC) 226 to convert the digital output signal DOUT to analog for combination with the output signal of OTA 222. The combination may be a difference between the amplified signal at the output of OTA 222 and the output signal of chopped-DAC 226. Thus, a difference may be obtained in current domain at the output of OTA 222. The chopped analog input signal 112 may thus be differentiated in current domain at the output of OTA 222. This differentiated signal (difference between the amplified signal at the output of OTA 222 and the output signal of chopped-DAC 226) is presented to the second analog chopper circuit 110 and to integrator 223, whose output progresses in a negative or positive direction. The slope and direction of the output of the integrator 223 is dependent on the sign and magnitude of the differentiated signal. At the time the differentiated signal equals the coarse ADC's (comparator's) 224 reference voltage, the output of the coarse ADC 224 switches from negative to positive, or positive to negative, depending on its original state. The output value DOUT of the coarse ADC 224 is clocked back into the 1-bit DAC 226, as well as clocked out to a digital filter stage (not shown).

When the choppers 110 change state at its half periods (chopping phases) (changing amplitudes from 1→−1, or from 1→−1), the chopped analog input signal 112 changes its polarity, causing a current spike due to the charging of parasitic capacitors (not shown) at the input of the OTA 222. The differential chopped analog input signal 112 is mostly provided by the OTA 222 via integration capacitors. However, the feedback signal is chopped again, making it independent of chopping edge direction. The feedback signal is then integrated on the integration capacitors ($C_{int}$), resulting in a sampled input-referred error signal. Any mismatch of the parasitic or integration capacitors will result in sampling of quantization noise also at $f_{chop}$.

Figure 3A:
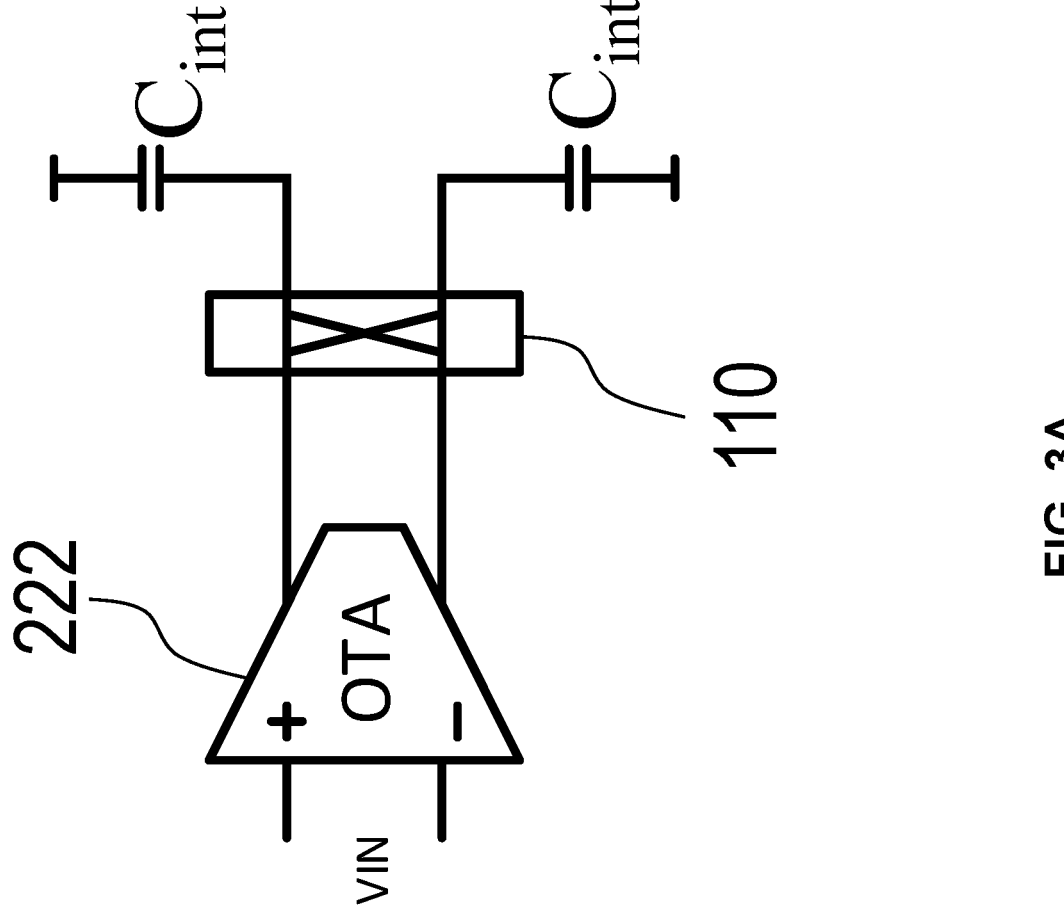
FIGS. 3A and 3B illustrate further implementations of chopped integrators that may be used inside ΣΔ-ADCs.
Figure 3B:
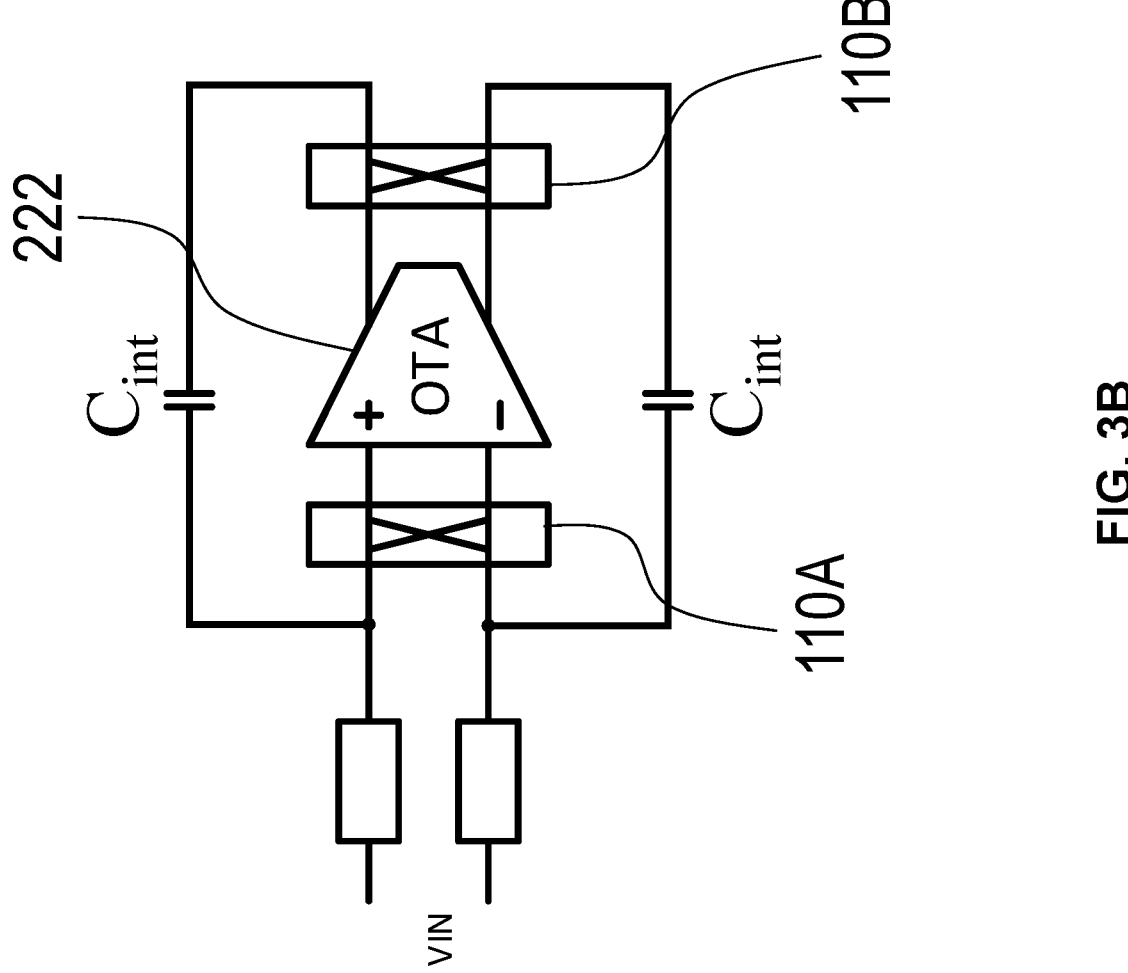

The skilled person having benefit from the present disclosure will appreciate that $\Sigma\Delta$-ADC circuit designs are not limited to the example of FIG. 2. Further options of chopped integrators that may be used in $\Sigma\Delta$-ADCs are sketched in FIGS. 3A and 3B.

Figure 4A:
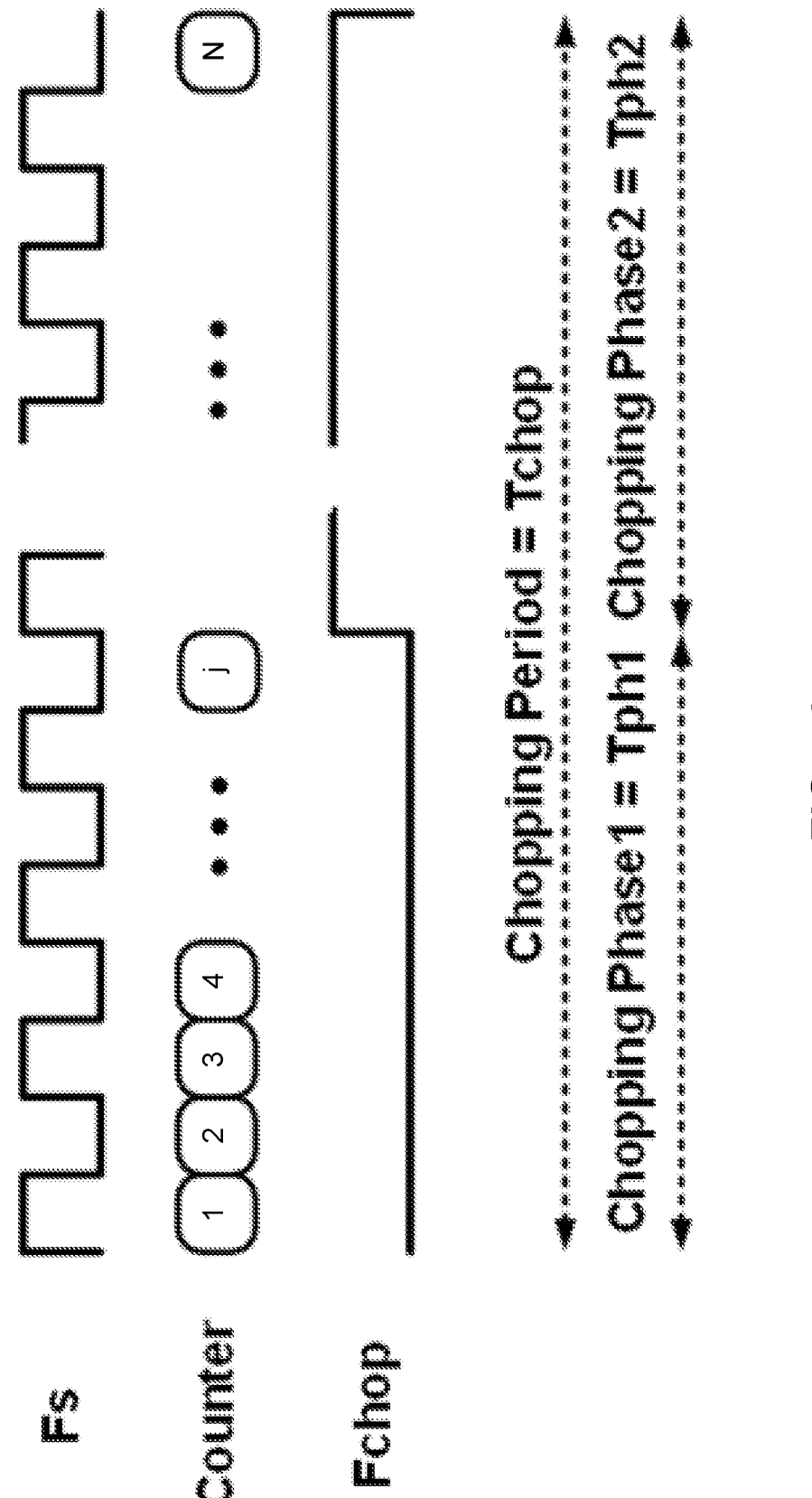
FIG. 4A illustrates a timing of a sampling clock signal and a chopping clock signal.

The chopping frequency $f_{chop}$ for chopper circuit(s) 110 in $\Sigma\Delta$-ADCs may be derived from the input sampling rate/ frequency $f_s$ of the coarse ADC 224 using timing circuit 130. The chopping frequency $f_{chop}$ may be higher than the original frequency of the analog input signal VIN (which may even be DC) but lower than the input sampling frequency $f_s$. As shown in the example of FIG. 4A, the chopping rate/ frequency may correspond to $f_{chop}=f/N$, where N denotes an integer larger than 1. In the present disclosure, the following notation will be applied: $T_{chop}=1/f_{chop}$ denotes the chopping period, $T_{ph}$ denotes the duration of a chopping phase $\Phi$, and $T_s=1/f_s$ denotes the sampling period (FIG. 2). A chopping period $T_{chop}$ usually comprises a first chopping phase $\Phi_1$ (here: low) of duration $T_{ph1}$ and a second chopping phase $\Phi_2$ (here: high) of duration $T_{ph2}$ with $T_{ph1}+T_{ph2}=T_{chop}$. During the first chopping phase $\Phi_1$ the input of the chopped $\Sigma\Delta$-ADC circuit 120 may be coupled to a first pair of (Hall) sensor terminals, during the second chopping phase $\Phi_2$, the input of the chopped $\Sigma\Delta$-ADC circuit 120 may be coupled to a different second pair of (Hall) sensor terminals.

As shown in FIG. 4A, the chopping period may conventionally correspond to $T_{chop}=N\cdot T_s$, where N is 2i (e.g., an even number, i=1, 2, 3, 4, 5, . . . ). Sometimes, the chopping period $T_{chop}$ may correspond to $(2^{m+1})\cdot T_s$. The durations $T_{ph1}$, $T_{ph2}$ may conventionally equally correspond to $T_{chop}/2=N/2\cdot T_s$, where N/2 may also be an even number. Sometimes, N/2 may correspond to 2 ml. Such a conventional relationship between chopping periods and sampling period $T_s$ may lead to undesired aliasing of quantization noise. High frequency quantization noise may fold-back into the signal band.

Conventionally, the durations $T_{ph1}$, $T_{ph2}$ of the chopping phases $\Phi_1$, $\Phi_2$ are adjusted equally such that $T_{ph1}=T_{ph2}=N/2\cdot T_s$. According to implementations of the present disclosure, however, timing circuit 130 may be configured to adjust a duration of at least one of the two chopping phases $\Phi_1$, $\Phi_2$ different from $N/2\cdot T_s$. In accordance with implementations of the present disclosure, the timing circuit 130 may be configured to adjust a duration $T_{ph1}$, $T_{ph2}$ of at least one of the first and the second chopping phases $\Phi_1$, $\Phi_2$ according to $(N/2-k)\cdot T_s$, with k being an odd integer equal to or larger than 1, e.g., k=1, 3, 5, 7, 9, . . . . In some implementations, N/2 may correspond to $2^m$ (e.g., $N=2^{m+1}$), m being an integer equal to or larger than 1. This is, in contrast to conventional $\Sigma\Delta$-ADC designs, where the durations $T_{ph1}$, $T_{ph2}$ of the first and the second chopping phases $\Phi_1$, $\Phi_2$ are set according to $(N/2)\cdot T_s$, implementations of the present disclosure propose to set the duration of at least one of the first and the second chopping phases $\Phi_1$, $\Phi_2$ according to $(N/2-k)\cdot T_s$, e.g., $T_{ph1}=(N/2-k)\cdot T_s$ and/or $T_{ph2}=(N/2-k)\cdot T_s$. This may desynchronize the integrator 223 of the $\Sigma\Delta$-ADC circuit 120, 224 and the chopping phases $\Phi_1$, $\Phi_2$, which may lead to an improved noise behavior of $\Sigma\Delta$-ADCs in accordance with implementations of the present disclosure.

Figure 4B:
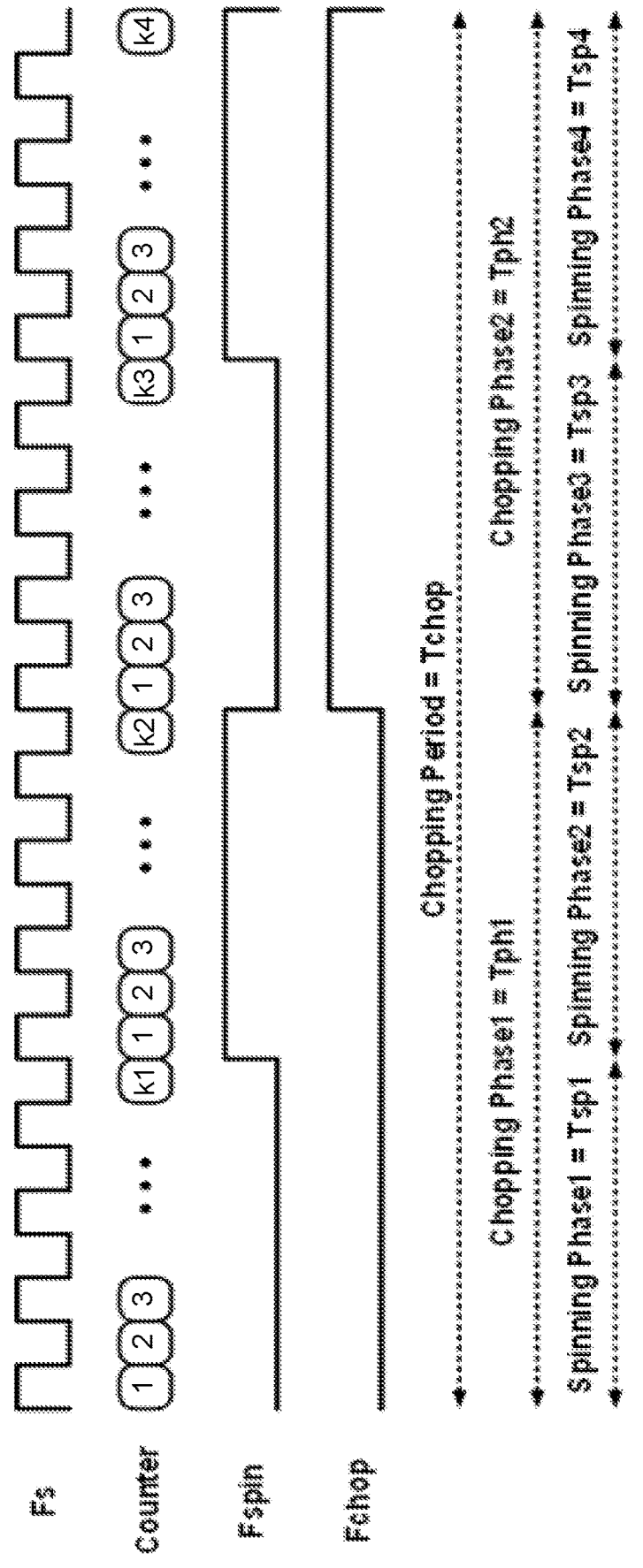
FIG. 4B illustrates a timing of a sampling clock signal, a chopping clock signal, and a spinning clock signal.

In one example implementation, the timing circuit 130 of the $\Sigma\Delta$-ADC 120 may be configured to adjust the durations $T_{ph1}$, $T_{ph2}$ of both the first and the second chopping phase $\Phi_1$, $\Phi_2$ according to $(N/2-k)\cdot T_s$, e.g., $T_{ph1}=(N/2-k)\cdot T_s$ and $T_{ph2}=(N/2-k)\cdot T_s$. As the first and the second chopping phase $\Phi_1$, $\Phi_2$ together form the chopping period $T_{chop}$, a duration of the chopping period may then correspond to $T_{chop}=(N-2k)\cdot T_s$. That is, the proposed chopping period $T_{chop}$ is shorter than $N\cdot T_s$. In the example of FIG. 4A, j may correspond to $(N/2-k)$. That is, the counter of timing circuit 130 may trigger a state transition between the first chopping phase $\Phi_1$ and the second chopping phase $\Phi_2$ (or vice versa) after $j=(N/2-k)$ sampling periods. In the example of FIG. 4B, k1+k2 may correspond to $(N/2-k)$. That is, the counter of timing circuit 130 may trigger a state transition between the first chopping phase $\Phi_1$ and the second chopping phase $\Phi_2$ (or vice versa) after $k1+k2=(N/2-k)$ sampling periods.

In another example implementation, the timing circuit 130 of the $\Sigma\Delta$-ADC 120 may be configured to adjust the duration of the first chopping phase $\Phi_1$ according to $T_{ph1}=(N/2-k)\cdot T_s$ and the duration of the second chopping phase $\Phi_2$ according to $T_{ph2}=N/2\cdot T_s$. As the first and the second chopping phase together form the chopping period, the duration of the chopping period may then correspond to $T_{chop}=(N-k)\cdot T_s$. Also in such implementations, the chopping period $T_{chop}$ is shorter than $N\cdot T_s$. In the example of FIG. 4B, k1+k2 may correspond to $(N/2-k)$ and k3+k4 may correspond to N/2. That is, the counter of timing circuit 130 may trigger a state transition between the first chopping phase di and the second chopping phase $\Phi_2$ (or vice versa) after $k1+k2=(N/2-k)$ sampling periods and the state transition between the second chopping phase $\Phi_2$ and the first chopping phase $\Phi_1$ (or vice versa) after another $k3+k4=N/2$ sampling periods.

Implementations of the present disclosure may optionally also be combined with a spinning Hall-sensor coupled to the input 102 of the ADC circuit 100. Hall sensors typically have an offset drift, which leads to an unpredictable and time-varying output error. Such offsets in Hall sensors can be reduced using a spinning current scheme, in which a bias current of a Hall sensor is spatially rotated around the Hall sensor while the output signals are time-averaged. This can reduce offset and offset drift. As can be seen in FIG. 4B, the chopping period $T_{chop}$ may comprise four spinning phases: a first spinning phase $T_{sp1}$, a second spinning phase $T_{sp2}$, a third spinning phase $T_{sp3}$, and a fourth spinning phase $T_{sp4}$. That is, $T_{chop}=T_{sp1}+T_{sp2}+T_{sp3}+T_{sp4}$. The first and second spinning phases $T_{sp1}$, $T_{sp2}$ take place during the first chopping phase $\Phi_1$, e.g., $T_{ph1}=T_{sp1}+T_{sp2}$. The third and fourth spinning phase $T_{sp3}$, $T_{sp4}$ take place during the second chopping phase $\Phi_2$, e.g., $T_{ph2}=T_{sp3}+T_{sp4}$.

During the first spinning phase $T_{sp1}$ (during first chopping phase $\Phi_1$), current flows across first terminals of the Hall sensor, so that a Hall voltage can be tapped at second terminals of the Hall sensor. During the second spinning phase $T_{sp2}$ (during first chopping phase $\Phi_1$), current flows across second terminals of the Hall sensor, so that a Hall voltage can be tapped at the first terminals of the Hall sensor. During the third spinning phase $T_{sp3}$ (during second chopping phase $\Phi_2$), current flows across the first terminals of the Hall sensor, so that a Hall voltage can be tapped at the second terminals of the Hall sensor. During the fourth spinning phase $T_{sp4}$ (during second chopping phase $\Phi_2$), current flows across the second terminals of the Hall sensor, so that a Hall voltage can be tapped at the first terminals of the Hall sensor.

Conventionally, durations of the four spinning phases are adjusted equally. For example, $T_{sp1}=T_{sp2}=T_{sp3}=T_{sp4}=N/4 \cdot T_s$. According to implementations of the present disclosure, however, timing circuit 130 may be configured to adjust durations of the four spinning phases differently. That is, at least one duration of at least one of the four spinning phases $T_{sp1}$, $T_{sp2}$, $T_{sp3}$, $T_{sp4}$ may differ from another duration of another one of the four spinning phases $T_{sp1}$, $T_{sp2}$, $T_{sp3}$, $T_{sp4}$. The timing circuit 130 may be configured to adjust a duration of at least one of the four spinning phases $T_{sp1}$, $T_{sp2}$, $T_{sp3}$, $T_{sp4}$, according to an odd number of sampling periods $T_s$ while others are adjusted according to even numbers of sampling periods $T_s$.

For example, timing circuit 130 may be configured to adjust respective durations of two of the four spinning phases $T_{sp1}$, $T_{sp2}$, $T_{sp3}$, $T_{sp4}$ according to an odd number of sampling periods $T_s$ and respective durations of the other two of the four spinning phases according to an even number of sampling periods $T_s$. In an example implementation, the timing circuit 130 may be configured to adjust the duration of the first spinning phase according to $T_{sp1}=(N/4-k) \cdot T_s$ (with k=1, 3, 5, 7, 9, . . . ), the duration of the second spinning phase according to $T_{sp2}=(N/4) \cdot T_s$, the duration of the third spinning phase according to $T_{sp3}=(N/4-k) \cdot T_s$, and the duration of the fourth spinning phase according to $T_{sp4}=(N/4) \cdot T_s$. This is under the assumption that N/4 is an equal number (e.g., $N/4=2^{m-1}$, with m≥2). In this case, $T_{ph1}=T_{sp1}+T_{sp2}=(N/4-k) \cdot T_s+N/4 \cdot T_s=(N/2-k) \cdot T_s$ and $T_{ph2}=T_{sp3}+T_{sp4}=(N/4-k) \cdot T_s+N/4 \cdot T_s=(N/2-k) \cdot T_s$. This results in a chopping period of $T_{chop}=(N-2k) \cdot T_s$. In the example of FIG. 4A, k1 may correspond to $(N/4-k)$. That is, the counter of timing circuit 130 may trigger a first state transition (from low to high, or from high to low) of the spinning clock signal after k1=(N/4-k) sampling periods. The counter of timing circuit 130 may then trigger a second state transition (from low to high, or from high to low) of the spinning clock signal after further k2=N/4 sampling periods. The counter of timing circuit 130 may then trigger a third state transition (from low to high, or from high to low) of the spinning clock signal after further k3=(N/4-k) sampling periods. The counter of timing circuit 130 may then trigger a fourth state transition (from low to high, or from high to low) of the spinning clock signal after further k4=N/4 sampling periods. Then the whole chopping/spinning cycle may be repeated.

For another example, the timing circuit 130 may be configured to adjust the duration of the first spinning phase according to $T_{sp1}=(N/4-k) \cdot T_s$ (with k=1, 3, 5, 7, 9, . . . ), the duration of the second spinning phase according to $T_{sp2}=N/$ $4 \cdot T_s$, the duration of the third spinning phase according to $T_{sp3}=N/4 \cdot T_s$, and the duration of the fourth spinning phase according to $T_{sp4}=N/4 \cdot T_s$. In this case, $T_{ph1}=T_{sp1}+T_{sp2}=(N/4-k) \cdot T_s+N/4 \cdot T_s=(N/2-k) \cdot T_s$ and $T_{ph2}=T_{sp3}+T_{sp4}=N/4 \cdot T_s+N/4 \cdot T_s=N/2 \ T_s$. This results in a chopping period of $T_{chop}=(N-k) \cdot T_s$.

The proposed modifications to the timing of chopping and/or spinning may lead to an improved quantization noise behavior of ΣΔ-ADCs in accordance with implementations of the present disclosure.

ASPECTS

The following provides an overview of some Aspects of the present disclosure:

Aspect 1: A sigma-delta analog-to-digital converter (ΣΔ-ADC) configured to convert an analog input signal to a digital output signal at a sampling frequency ($f_s$), the ΣΔ-ADC comprising: a chopper circuit configured to shift the analog input signal from an original frequency to a chopper frequency ($f_{chop}$) to generate a chopped analog signal, wherein $f_{chop}=f_s/N$, and N is a positive integer with N≥1, wherein a chopper period comprises a first chopper phase and a second chopper phase; and a timing circuit configured to adjust at least one of a duration of the first chopper phase or a duration of the second chopper phase according to $(N/2-k) \cdot T_s$, with k being an odd integer equal to or larger than 1, and $T_s$ being a sampling period $1/f_s$ of the ΣΔ-ADC.

Aspect 2: The ΣΔ-ADC of Aspect 1, wherein the timing circuit is configured to adjust the duration of both the first chopper phase and the duration of the second chopper phase according to $(N/2-k) \cdot T_s$.

Aspect 3: The ΣΔ-ADC of any of Aspects 1-2, wherein the timing circuit is configured to adjust the duration of the first chopper phase according to $(N/2-k) \cdot T_s$ and adjust the duration of the second chopper phase according to $(N/2) \cdot T_s$.

Aspect 4: The ΣΔ-ADC of any of Aspects 1-3, wherein k=1.

Aspect 5: The ΣΔ-ADC of any of Aspects 1-4, further comprising: a spinning Hall-sensor coupled to an input of the ΣΔ-ADC, wherein a spinning period comprises four spinning phases, including a first spinning phase, a second spinning phase, a third spinning phase, and a fourth spinning phase, wherein the timing circuit is configured to adjust respective durations of a first two of the four spinning phases according to an odd number of sampling periods $T_s$ and adjust respective durations of a second two of the four spinning phases according to an even number of sampling periods $T_s$.

Aspect 6: The ΣΔ-ADC of Aspect 5, wherein the timing circuit is configured to adjust the duration of the first spinning phase according to $(N/4-k) \cdot T_s$, adjust the duration of the second spinning phase according to $(N/4) \cdot T_s$, adjust the duration of the third spinning phase according to $(N/4-k) \cdot T_s$, and adjust the duration of the fourth spinning phase according to $(N/4) \cdot T_s$.

Aspect 7: The ΣΔ-ADC of any of Aspects 1-6, comprising: a first chopper circuit configured to shift the analog input signal from the original frequency to the chopper frequency to generate the chopped analog signal; a difference amplifier configured to amplify the chopped analog signal to generate an amplified analog signal; and a second chopper circuit configured to demodulate the amplified analog signal to generate a demodulated analog signal having a signal component at the original frequency.

Aspect 8: The ΣΔ-ADC of Aspect 7, further comprising: an integrator coupled to an output of the second chopper circuit; and a coarse ADC configured to convert an output of the integrator into the digital output signal.

Aspect 9: The ΣΔ-ADC of Aspect 8, further comprising: a feedback path coupled between an output of the coarse ADC and an input of the of the second chopper circuit, the feedback path comprising a chopped digital-to-analog converter (DAC).

Aspect 10: A sigma-delta analog-to-digital converter (ΣΔ-ADC) configured to convert an analog input signal to a digital output signal at a sampling frequency ($f_s$), the ΣΔ-ADC comprising: a chopper circuit configured to shift the analog input signal from an original frequency to a chopper frequency to generate a chopped analog signal, wherein a chopper period comprises a first chopper phase and a second chopper phase; and a timing circuit configured to adjust at least one of a duration of the first chopper phase or a duration of the second chopper phase according to $(4n-1) \cdot T_s$, with n being an integer equal to or greater than 1, and $T_s$ being a sampling period $1/f_s$ of the ΣΔ-ADC.

Aspect 11: The ΣΔ-ADC of Aspect 10, wherein the timing circuit is configured to adjust the duration of the first chopper phase and the duration of the second chopper phase according to $(4n-1) \cdot T_s$.

Aspect 12: The ΣΔ-ADC of any of Aspects 10-11, wherein the timing circuit is configured to adjust the duration of the first chopper phase according to $(4n-1) \cdot T_s$ and adjust the duration of the second chopper phase according to $4n \cdot T_s$.

Aspect 13: The ΣΔ-ADC of Aspect 11, further comprising: a spinning Hall-sensor coupled to an input of the ΣΔ-ADC, wherein a spinning period comprises a first spinning phase, a second spinning phase, a third spinning phase, and a fourth spinning phase, wherein the timing circuit is configured to adjust a duration of the first spinning phase according to $(2n-1) \cdot T_s$, adjust a duration of the second spinning phase according to $2n \cdot T_s$, adjust a duration of the third spinning phase according to $(2n-1) \cdot T_s$, and adjust a duration of the fourth spinning phase according to $2n \cdot T_s$.

Aspect 14: A method for converting an analog input signal to a digital output signal at a sampling frequency ($f_s$) of a sigma-delta analog-to-digital converter (ΣΔ-ADC), the method comprising: shifting the analog input signal from an original frequency to a chopper frequency to generate a chopped analog signal, wherein a chopper period comprises a first chopper phase and a second chopper phase; and adjusting a duration of at least one of the first chopper phase or the second chopper phase according to $(4n-1) \cdot T_s$, with n being an integer equal to or greater than 1, and $T_s$ being a sampling period $1/f_s$ of the ΣΔ-ADC.

Aspect 15: A system configured to perform one or more operations recited in one or more of Aspects 1-14.

Aspect 16: An apparatus comprising means for performing one or more operations recited in one or more of Aspects 1-14.

The aspects and features described in relation to a particular one of the previous examples may also be combined with one or more of the further examples to replace an identical or similar feature of that further example or to additionally introduce the features into the further example.

Examples may further be or relate to a (computer) program including a program code to execute one or more of the above methods when the program is executed on a computer, processor or other programmable hardware component. Thus, steps, operations or processes of different ones of the methods described above may also be executed by pro-grammed computers, processors or other programmable hardware components. Examples may also cover program storage devices, such as digital data storage media, which are machine-, processor- or computer-readable and encode and/or contain machine-executable, processor-executable or computer-executable programs and instructions. Program storage devices may include or be digital storage devices, magnetic storage media such as magnetic disks and magnetic tapes, hard disk drives, or optically readable digital data storage media, for example. Other examples may also include computers, processors, control units, (field) programmable logic arrays ((F)PLAs), (field) programmable gate arrays ((F)PGAs), graphics processor units (GPU), application-specific integrated circuits (ASICs), integrated circuits (ICs) or system-on-a-chip (SoCs) systems programmed to execute the steps of the methods described above.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

The invention claimed is:

1. A sigma-delta analog-to-digital converter (ΣΔ-ADC) configured to convert an analog input signal to a digital output signal at a sampling frequency ($f_s$), the ΣΔ-ADC comprising:

a chopper circuit configured to shift the analog input signal from an original frequency to a chopper frequency ($f_{chop}$) to generate a chopped analog signal, wherein $f_{chop}=f_s/N$, and N is a positive integer with $N \geq 1$, wherein a chopper period comprises a first chopper phase and a second chopper phase; and a timing circuit configured to adjust at least one of a duration of the first chopper phase or a duration of the second chopper phase according to $(N/2-k) \cdot T_s$, with k being an odd integer equal to or larger than 1, and $T_s$ being a sampling period $1/f_s$ of the $\Sigma\Delta$-ADC.

2. The $\Sigma\Delta$-ADC of claim 1, wherein the timing circuit is configured to adjust the duration of both the first chopper phase and the duration of the second chopper phase according to $(N/2-k)\cdot T_s$.

3. The $\Sigma\Delta$-ADC of claim 1, wherein the timing circuit is configured to adjust the duration of the first chopper phase according to $(N/2-k)\cdot T_s$ and adjust the duration of the second chopper phase according to $(N/2)\cdot T_s$.

4. The $\Sigma\Delta$-ADC of claim 1, wherein k=1.

5. The $\Sigma\Delta$-ADC of claim 1, further comprising:

a spinning Hall-sensor coupled to an input of the $\Sigma\Delta$-ADC, wherein a spinning period comprises four spinning phases, including a first spinning phase, a second spinning phase, a third spinning phase, and a fourth spinning phase, wherein the timing circuit is configured to adjust respective durations of a first two of the four spinning phases according to an odd number of sampling periods $T_s$ and adjust respective durations of a second two of the four spinning phases according to an even number of sampling periods $T_s$.

6. The $\Sigma\Delta$-ADC of claim 5, wherein the timing circuit is configured to adjust the duration of the first spinning phase according to $(N/4-k)\cdot T_s$, adjust the duration of the second spinning phase according to $(N/4)\cdot T_s$, adjust the duration of the third spinning phase according to $(N/4-k)\cdot T_s$, and adjust the duration of the fourth spinning phase according to $(N/4)\cdot T_s$.

7. The $\Sigma\Delta$-ADC of claim 1, comprising:

a first chopper circuit configured to shift the analog input signal from the original frequency to the chopper frequency to generate the chopped analog signal;

a difference amplifier configured to amplify the chopped analog signal to generate an amplified analog signal; and a second chopper circuit configured to demodulate the amplified analog signal to generate a demodulated analog signal having a signal component at the original frequency.

8. The $\Sigma\Delta$-ADC of claim 7, further comprising:

an integrator coupled to an output of the second chopper circuit; and a coarse ADC configured to convert, at the sampling frequency, an output of the integrator into the digital output signal.

9. The E$\Delta$-ADC of claim 8, further comprising:

a feedback path coupled between an output of the coarse ADC and an input of the second chopper circuit, the feedback path comprising a chopped digital-to-analog converter (DAC).

10. The $\Sigma\Delta$-ADC of claim 1, wherein the timing circuit is configured to receive a sampling clock signal having the sampling frequency, and generate a chopping clock signal at the chopping frequency based on a frequency division of the sampling clock signal by N such that $f_{chop}=f_s/N$, and wherein the chopper circuit is configured to receive the chopping clock signal and shift the analog input signal from the original frequency to the chopper frequency using the chopping frequency provided by the chopping clock signal.

11. The $\Sigma\Delta$-ADC of claim 10, wherein the chopping clock signal has the chopper period, and wherein the timing circuit is configured to adjust the chopping clock signal in order to adjust at least one of the duration of the first chopper phase or the duration of the second chopper phase according to $(N/2-k)\cdot T_s$.

12. The $\Sigma\Delta$-ADC of claim 10, further comprising:

an integrator coupled to an output of the chopper circuit; and a coarse ADC configured to convert, at the sampling frequency, an output of the integrator into the digital output signal.

13. The $\Sigma\Delta$-ADC of claim 10, wherein N is a positive integer with N>1.

14. A method for converting an analog input signal to a digital output signal at a sampling frequency ($f_s$) of a sigma-delta analog-to-digital converter ($\Sigma\Delta$-ADC), the method comprising:

shifting the analog input signal from an original frequency to a chopper frequency to generate a chopped analog signal, wherein a chopper period comprises a first chopper phase and a second chopper phase; and adjusting at least one of a duration of the first chopper phase or a duration of the second chopper phase according to $(4n-1)\cdot T_s$, with n being an integer equal to or greater than 1, and $T_s$ being a sampling period $1/f_s$ of the $\Sigma\Delta$-ADC.

15. A sigma-delta analog-to-digital converter ($\Sigma\Delta$-ADC) configured to convert an analog input signal to a digital output signal at a sampling frequency ($f_s$), the $\Sigma\Delta$-ADC comprising:

a chopper circuit configured to shift the analog input signal from an original frequency to a chopper frequency to generate a chopped analog signal, wherein a chopper period comprises a first chopper phase and a second chopper phase; and a timing circuit configured to adjust at least one of a duration of the first chopper phase or a duration of the second chopper phase according to $(4n-1)\cdot T_s$, with n being an integer equal to or greater than 1, and $T_s$ being a sampling period $1/f_s$ of the $\Sigma\Delta$-ADC.

16. The $\Sigma\Delta$-ADC of claim 15, wherein the timing circuit is configured to adjust the duration of the first chopper phase and the duration of the second chopper phase according to $(4n-1)\cdot T_s$.

17. The $\Sigma\Delta$-ADC of claim 16, further comprising:

a spinning Hall-sensor coupled to an input of the $\Sigma\Delta$-ADC, wherein a spinning period comprises a first spinning phase, a second spinning phase, a third spinning phase, and a fourth spinning phase, wherein the timing circuit is configured to adjust a duration of the first spinning phase according to $(2n-1)\cdot T_s$, adjust a duration of the second spinning phase according to $2n\cdot T_s$, adjust a duration of the third spinning phase according to $(2n-1)\cdot T_s$, and adjust a duration of the fourth spinning phase according to $2n\cdot T_s$.

18. The $\Sigma\Delta$-ADC of claim 15, wherein the timing circuit is configured to adjust the duration of the first chopper phase according to $(4n-1)\cdot T_s$ and adjust the duration of the second chopper phase according to $4n\cdot T_s$.

* * * * *